US007012287B2

(12) United States Patent
Kobayashi

(10) Patent No.: US 7,012,287 B2
(45) Date of Patent: *Mar. 14, 2006

(54) HEMT DEVICE WITH A MESA ISOLATING MULTILAYER FILM

(75) Inventor: Junichiro Kobayashi, Kanagawa (JP)

(73) Assignee: Sony Corporation, (JP)

( * ) Notice: Subject to any disclaimer, the term of this patent is extended or adjusted under 35 U.S.C. 154(b) by 24 days.

This patent is subject to a terminal disclaimer.

(21) Appl. No.: 11/084,129

(22) Filed: Mar. 21, 2005

(65) Prior Publication Data

US 2005/0161736 A1 Jul. 28, 2005

Related U.S. Application Data

(60) Continuation of application No. 10/989,359, filed on Nov. 17, 2004, which is a division of application No. 10/339,416, filed on Jan. 10, 2003, now Pat. No. 6,853,016.

(30) Foreign Application Priority Data

Jan. 16, 2002 (JP) .......................... P2002-006946

(51) Int. Cl.
*H01L 31/0328* (2006.01)
*H01L 21/388* (2006.01)
(52) U.S. Cl. ...................... 257/194; 438/167; 438/172; 438/191
(58) Field of Classification Search ..................... None
See application file for complete search history.

(56) References Cited

U.S. PATENT DOCUMENTS

| 5,128,276 A | 7/1992 | Ambrosius et al. ........... 438/40 |
| 5,357,119 A | 10/1994 | Wang et al. ................... 257/18 |
| 5,793,055 A | 8/1998 | Kastalsky ..................... 257/24 |
| 6,429,468 B1 | 8/2002 | Hsu et al. .................... 257/194 |
| 6,674,100 B1 | 1/2004 | Kubo et al. .................. 257/194 |
| 6,711,723 B1 | 3/2004 | Tsai et al. ....................... 716/4 |
| 6,853,016 B1 * | 2/2005 | Kobayashi .................. 257/194 |

FOREIGN PATENT DOCUMENTS

| JP | 03-066135 | 3/1991 |
| JP | 2003-059945 | 2/2003 |

* cited by examiner

*Primary Examiner*—Alonzo Chambliss
(74) *Attorney, Agent, or Firm*—Rader, Fishman & Grauer PLLC; Ronald P. Kananen

(57) ABSTRACT

To provide a semiconductor device which makes it possible to avoid deterioration in the step coverage property at a gate electrode provided on an operating region and decrease a leakage current between the operating region and the gate electrode. The semiconductor device arranged as a HEMT is made to include an operating region composed of multilayer films, such as a channel layer, an electron supplying layer and other semiconductor layer, and having an island structure independently mesa-isolated from one another. The semiconductor device also includes a gate electrode and an impurity diffusion layer provided on the surface of the operating region, the impurity diffusion layer being doped with an impurity having a conductivity type inverse to the impurity doped into the electron supplying layer.

1 Claim, 5 Drawing Sheets

HEMT DEVICE WITH A MESA ISOLATING MULTILAYER FILM

CROSS REFERENCE TO RELATED APPLICATIONS

The present application is a Continuation Application of the patent application Ser. No. 10/989,359, filed on Nov. 17, 2004, which is a Divisional Application of the patent application Ser. No. 10/339,416, filed on Jan. 10, 2003 now U.S. Pat. No. 6,853,016, which is based on Japanese Priority Document JP2002-006946, filed in the Japanese Patent Office on Jan. 16, 2002, the entire contents of which are incorporated herein by reference.

BACKGROUND OF THE INVENTION

1. Field of the Invention

The present invention relates to a semiconductor device and a method of fabricating the device. More particularly, the present invention relates to a HEMT (High Electron Mobility Transistor) which intends to reduce a gate leakage current.

2. Description of Related Art

FIG. 6 is a plan view showing one example of a semiconductor device having a HEMT structure. FIG. 7 is a cross-sectional view taken along a line VII–VII' in FIG. 6. As shown in FIGS. 6 and 7, the semiconductor device has a structure consisting of a semi-insulating substrate 1, a buffer layer 2, a channel layer 3, a spacer layer 4, an electron supplying layer 5 and a barrier layer 6, which are sequentially deposited onto the semi-insulting substrate 1 by using an epitaxial growth method (see FIG. 7). Thus, an operating region 11 can be formed as an element of the HEMT.

As shown in FIG. 6, three electrodes, namely, a source electrode 7, a gate electrode 8, and a drain electrode 9, are disposed on the barrier layer 6. The gate electrode 8 is provided so that a Schottky contact is established between the gate electrode 8 and the barrier layer 6. Further, the source electrode (pad) 7 and the drain electrode (pad) 9 are provided so that an Ohmic contact is established with respect to the channel layer 3.

The channel layer 3 is made of an InGaAs layer having no impurity doped thereinto (i.e., highly purified material). The electron supplying layer 5 is made of an n-type InAlAs layer doped with Si as an impurity, for example.

The semiconductor device (HEMT) constructed as described above has an electron affinity larger at the channel layer 3 than at the electron supplying layer 5. Therefore, electrons released from impurity atoms doped into the electron supplying layer 5 will be moved to the channel layer 3 and intensively concentrated in two dimensions at the surface of the channel layer 3. Since the channel layer 3 is made of a highly purified crystalline material containing no impurity, and hence there is little dispersion due to the impurity, the electrons concentrated at the surface of the channel layer 3 can move through the surface thereof with a high electron mobility. Furthermore, since the electron density also is high, a transistor operating at a high speed can be realized.

The barrier layer 6 is made of a non-doped InAlAs layer. Owing to the presence of the barrier layer 6, electrons can be prevented from moving between the operating region 11 and the gate electrode 8, so that a gate leakage current can be suppressed.

The spacer layer 4 is made of a non-doped InAlAs layer. Owing to the presence of the spacer layer 4, the channel layer 3 can be protected from an electric influence from impurity ions that have released electrons. Thus, electrons can be moved through the channel layer 3 without the influence. The buffer layer 2 also is made of a non-doped InAlAs layer. Owing to the presence of the buffer layer 2, the channel layer 3 can be protected from an influence from a crystalline defect of the semi-insulating substrate 1 made of InP. If the semi-insulating substrate 1 is made of a material having a satisfactory crystalline nature, the buffer layer 2 is not always necessary.

In general, a semiconductor device, as a method for electrically insulated separation of adjacent elements, there is employed a method in which ions such as $B^+$, $O^+$ are implanted to create a high resistivity region between the semiconductor elements requested to be insulated from each other. However, if the semiconductor device has a structure in which the non-doped InGaAs layer (channel layer 3) and the n-type InAlAs layer (electron supplying layer 5) are epitaxially grown on the semi-insulating substrate 1 as described above, ion implantation to form the high resistivity region is impossible. Therefore, if the HEMT has the above-described structure, a so-called mesa isolation method is introduced. That is, a wet etching is effected on the semiconductor device to remove unnecessary portions so that the operating regions 11 can be made into an island structure in which elements are separated and electrically isolated from one another.

The gate electrode 8 is formed so as to extend from an upper surface of the operating region 11, which is separated from other components on the substrate as an island structure by means of a mesa isolation method, to a periphery side of the operating region 11 so as to cover a side wall 12a thereof. This method is employed to respond to the following two requests: a high accuracy in mask alignment at the time when a gate electrode is formed on the device, and controllability of a drain current over the wider area of the operating region 11 owing to the electric field effect of the gate electrode 8. Meanwhile, the other end side of the gate electrode 8 is similarly extended toward the outside of the operating region 11 and connected to a gate leading portion (or a pad portion).

However, in the semiconductor device having the above-described structure, the gate electrode 8 will be brought into contact with the non-doped InGaAs layer (channel layer 3) and the n-type InAlAs layer (the electron supplying layer 5) at the side wall portion 12a of the operating region 11. Furthermore, the materials of InGaAs and n-type InAlAs essentially have a narrow band gap, and a Schottky barrier thereof with respect to a gate electrode made of a metal is low. Therefore, there is a problem in which movement of the electrons between the channel layer 3 or the electron supplying layer 5 and the gate electrode 8, that is, a gate leakage current, is increased so that HEMT performance is deteriorated.

FIG. 8 shows a conventional arrangement for avoiding the above-described problems. As shown in FIG. 8, the operating region 11 is patterned into an island structure to be mesa isolated. Thereafter, the non-doped InGaAs layer (the channel layer 3) is selectively etched with respect to other layers made of InAlAs so that the side wall portions of the channel layer 3 are recessed. Subsequently, the gate electrode 8 is formed. In this way, a space a is provided between the gate electrode 8 and the channel layer 3. According to the above-mentioned method, however, the selective etching ratio of the InGaAs layer relative to the InAlAs layer is not satisfactory. Furthermore, it is unavoidable for the gate electrode 8 to be contacted to the n-type InAlAs layer (the electron supplying layer 5). Therefore, an effect of reducing the aforementioned gate leakage current is not obtained satisfactorily.

FIG. 9 is a diagram for explaining a method in which the gate electrode 8 can be prevented from being contacted to a side wall 12b. As shown in FIG. 9, when the operating region 11 is patterned into an island structure to be mesa isolated, the gate electrode 8 is prevented from contacting the side wall 12b by making the side wall 12b into an inverted-taper shape. In this case, however, the operating region 11 cannot have the benefit of satisfactory step coverage at an upper corner thereof, and the gate electrode 8 will suffer from cut up there. Further, when the operating region 11 undergoes the patterning process, the gate electrode extending direction, is limited depending on the crystal orientation of the side wall 12b i.e., a pattern layout is limited because of the inverted-taper shape at the side wall 12b.

SUMMARY OF THE INVENTION

The present invention seeks to solve the above-identified problems. Therefore, the present invention intends to provide a semiconductor device and a method of fabricating the device which decreases a leakage current between the operating region and the gate electrode without deteriorating the step coverage property at a gate electrode provided on an operating region in an island structure to be mesa isolated from other components.

According to the present invention, there is a semiconductor device having an operating region formed by mesa-isolating multilayer films of semiconductor layers including a first conductivity type impurity into an island structure, and an electrode film provided on the operation region so as to extend from an upper surface to a side wall of the operating region, wherein the semiconductor device comprises an impurity diffusion layer including a second conductivity type impurity which is different from the first conductivity type impurity doped into the multilayer films of a surface layer of the side wall of the operating region at an area contacting with the electrode film. The second conductivity type impurity may be an inverse conductivity type relative to the first conductivity type impurity, and the impurity diffusion layer including the second conductivity type impurity may be provided on a surface layer of the operating region at an area contacting with the electrode film. The semiconductor device may be arranged as a HEMT semiconductor device, and the first conductivity type impurity may be an n-type and the second conductivity type impurity may be a p-type.

According to the present invention, there is proposed a method of fabricating a semiconductor device comprising the steps of: forming multilayer films including a first conductivity type impurity on a substrate; forming an operating region by processing a mesa-isolation into an island structure by etching the multilayer films utilizing a pattern formed on the multilayer films as a mask; forming, at a side wall of the operation region, an impurity diffusion layer including a second conductivity type impurity which is different from said first conductivity type impurity doped into the multilayer films; and forming an electrode on said operating region from an upper surface to a side wall after removing said pattern.

In the present invention, there is proposed another method of fabricating a semiconductor device comprising the steps of: forming multilayer films including a first conductivity type impurity on a substrate; forming an operating region by processing a mesa-isolation into an island structure by etching the multilayer films utilizing a pattern formed on the multilayer films as a mask; forming an isolation film on an upper side of the substrate so as to cover the operating region after removing the pattern; forming an electrode aperture in said insulating film so as to extend from the upper surface to the side wall of the operating region; forming an impurity diffusion layer by applying a second conductivity type impurity, which is different from the first conductivity type impurity doped into the multilayer film, to an exposed surface layer of the operating region through the electrode aperture; and forming an electrode extending from the upper surface to the side wall of the operating region so that the electrode embeds in the electrode aperture. The second conductivity type impurity may be an inverse conductivity type relative to the first conductivity type impurity, and the impurity of said second conductivity type may be an inverse conductivity type to the first conductivity type impurity. The semiconductor device may be arranged as a HEMT semiconductor device, and the first conductivity type impurity may be an n-type and the second conductivity type impurity may be a p-type.

According to the above-identified methods of fabricating the semiconductor device, it is possible to obtain a semiconductor device having the gate electrode provided on the impurity diffusion layer formed on the side wall surface layer of the operating region.

The above and other objects, features and advantages of the present invention will become apparent from the following description with reference to the accompanying drawings which illustrate examples of the present invention.

DESCRIPTION OF THE PREFERRED EMBODIMENTS

Figure 1A:
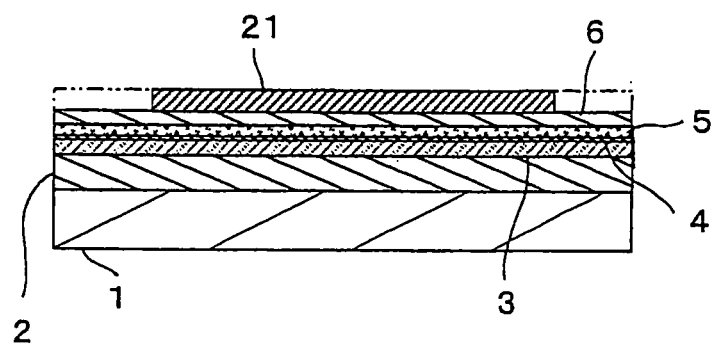
FIG. 1A to FIG. 1E are cross-sectional views of a semiconductor device under fabrication steps for explaining a method of fabricating a first embodiment of the present invention.

Now, several embodiments of the present invention will be hereinafter described with reference to the attached drawings. In the following description, steps of fabricating the semiconductor device will be initially described, and subsequently a structure of the semiconductor device deriving from the steps of fabrication will be described. Further, similar parts in figures corresponding to those of the conventional semiconductor device described above are identified by the same reference numerals and a description in detail is omitted.

FIRST EMBODIMENT

Figure 6:
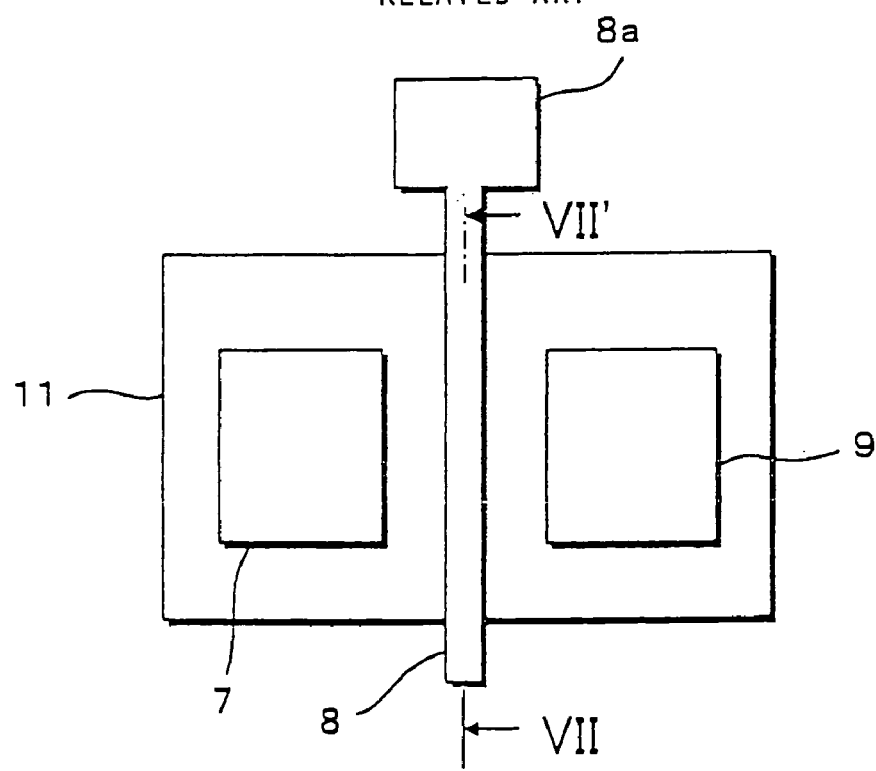
FIG. 6 is a schematic plan view illustrative of a structure of a conventional HEMT.
Figure 7:
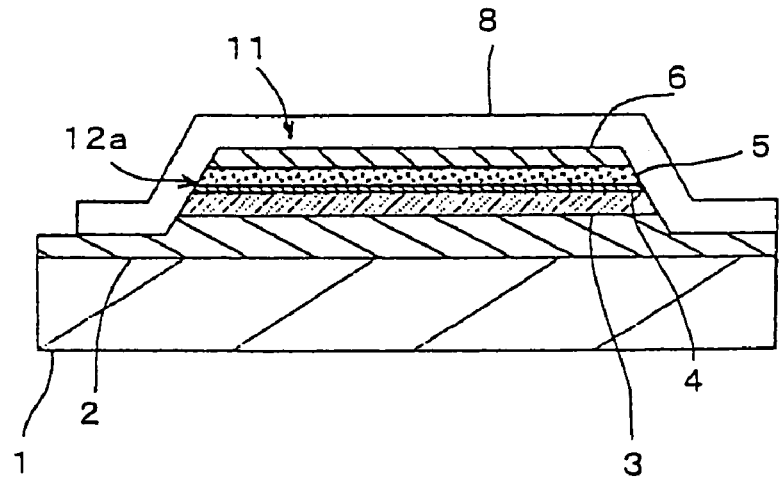
FIG. 7 is a cross-sectional view taken along a line VII–VII' in FIG. 6.
Figure 8:
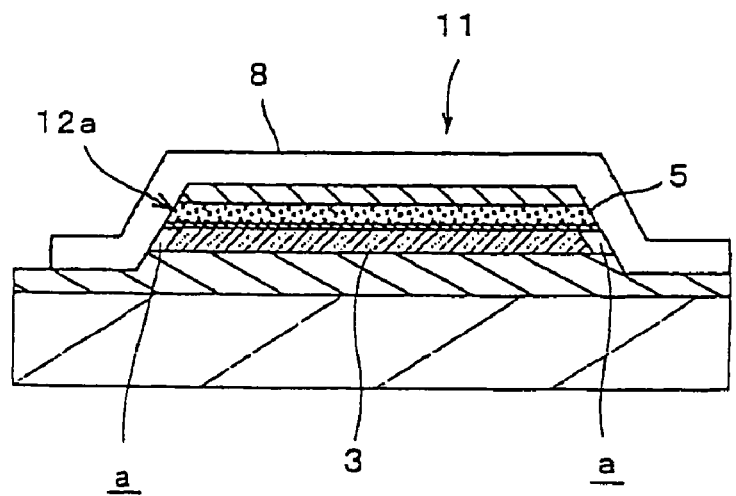
FIG. 8 is a cross-sectional view illustrative of a structure of another conventional HEMT.
Figure 9:
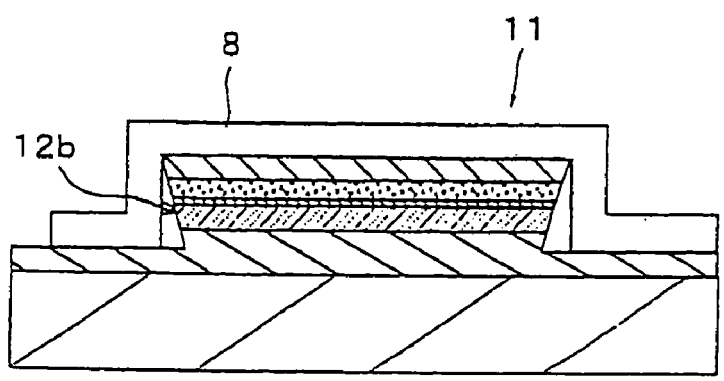
FIG. 9 is a cross-sectional view illustrative of a structure of still another conventional HEMT.

FIG. 1A to FIG. 1E are cross-sectional views of a semiconductor device as the first embodiment of the present invention for explaining a method of fabricating a HEMT. As shown in the figures, all of the diagrams are cross-sectional views taken along a line which corresponds to the line of VII–VII' of FIG. 6 utilized for explaining the conventional technology.

Initially, as shown in FIG. 1A, a semi-insulating substrate (InP) 1 is prepared, and multilayer films consisting of the semiconductor layers cited below are sequentially deposited in order on the semi-insulating substrate 1 to be epitaxial grown. Exemplified thicknesses of each of the semiconductor layers are listed below. The semi-insulating substrate 1 is not necessarily made of InP but may be made of Si, GaAs or the like.

The buffer layer (non-doped InAlAs layer) is 2 . . . 500 nm
The channel layer (non-doped InGaAs layer) is 3 . . . 15 nm
The spacer layer (non-doped InAlAs layer) is 4 . . . 2 nm
The electron supplying layer (n-type InAlAs layer) is 5 . . . 10 nm
The barrier layer (non-doped InAlAs layer) is 6 . . . 30 to 100 nm In particular, it is preferable for the non-doped InGaAs layer constituting the channel layer to be made up of $In_xGa_{(1-x)}As$ (where x represents a number of 0.4 or larger).

Subsequently, a pattern 21 made of an insulating material is formed on the barrier layer 6. At this time, if the pattern 21 is made of an insulating film such as SiN or the like, then a lithography technology is carried out on the insulating film to form a resist pattern. Then, the insulating pattern 21 is formed by etching the insulating film using this resist pattern as a mask. On the other hand, if the pattern 21 is made of a resist material, the pattern 21 is formed by the lithography technology.

Figure 1B:
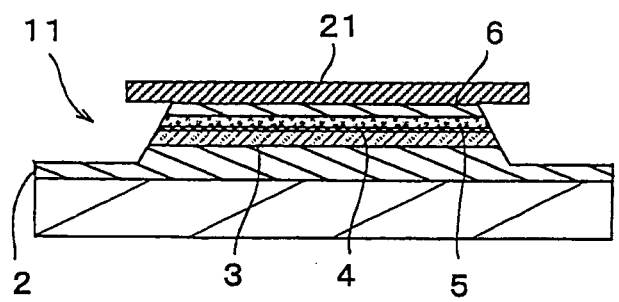

Then, as shown in FIG. 1B, each semiconductor layers 2 to 6 on the semi-insulating substrate 1 is patterned by etching using the pattern 21 as a mask, so that a part of the multilayer films composed of the semiconductor layers 2 to 6 is formed into an operating region 11 as an island structure that is mesa-isolated from the other components on the semiconductor device. At this time, the etching depth is set in order to completely isolated at least the channel layer 3 and the etching reaches even the buffer layer 2. Further, for this etching, a side etching is carried out beneath the pattern 21 by isotropic etching, such as wet etching, so that the side wall of the operating region 11 is shaped into a taper shape.

Figure 1C:
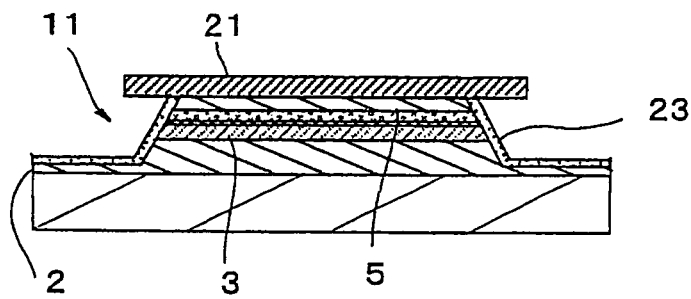

Thereafter, as shown in FIG. 1C, an impurity diffusion layer 23 is formed on the side wall surface layer of the operating region 11 by impurity diffusion using the pattern 21 as a mask. The electric conductivity type of the impurity diffusion layer 23 is set to a p-type which is inverse to that of the electron supplying layer 5 made of an n-type InAlAs layer. In this case, Zn is selected as a p-type impurity, and the diffusion processing is carried out under a diethyl-Zn atmosphere at a temperature of about 60° C. When this diffusion processing is carried out, the impurity diffusion layer 23 can be formed over the entire exposed area of the surface layer except the covered area with the pattern 21.

Figure 1D:
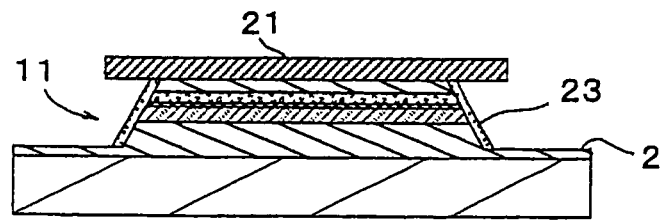

In the next step, as shown in FIG. 1D, by an anisotropic etching using the pattern 21 as a mask, the impurity diffusion layer 23 is partly left at the side wall portion of the operating region 11, and the impurity diffusion layer 23 formed at the other portion (surface layer of the buffer layer 2) is completely removed. This anisotropic etching is carried out by an RIE (reactive ion etching), an ion milling or the like. After the etching is completed, the pattern 21 is removed.

Figure 1E:
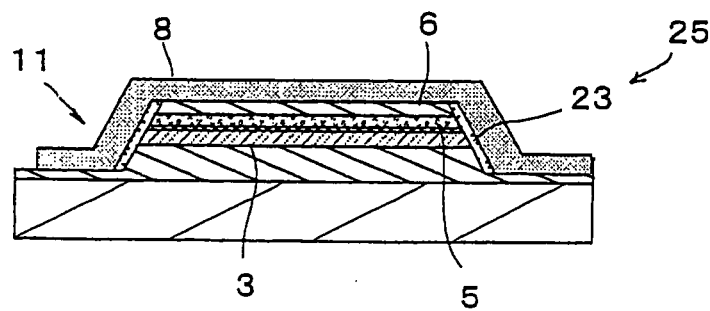

Subsequently, as shown in FIG. 1E, a gate electrode 8 is provided by means of vapor deposition or the like so as to cover from the upper portion to the side wall of the operating region 11 and also to extend toward the outside of the same. The gate electrode 8 is composed of, for example, an underlayer made of Ti (50 nm), an intermediate layer of Pt (50 nm) and an upper layer of Au (300 nm), sequentially deposited from the lower to the upper thereof in this order. These films may be deposited on the upper surface of the device, and, thereafter, a pattern etching is carried out to form the shape of the gate electrode 8. Alternatively, the pattern formation may be carried out by a known method, such as a lift-off method.

After the above processes are completed, although not shown, a source electrode and a drain electrode brought into ohmic contact with the channel layer 3 are formed on the barrier layer 6. These electrodes may be formed by depositing, for example, patterning films of Ni (40 nm) on an AuGe film (160 nm), the film to form the shapes of the electrodes. If necessary, a heat treatment (e.g., a heat treatment at a temperature of 400° C.) may be carried out after the formation of the electrodes so that an Ohmic region is created directly beneath the source electrode and the drain electrode. In this way, resistance between the channel layer 3 and the source electrode and resistance between the channel layer 3 and the drain electrode can be further decreased.

The HEMT 25 obtained by the above processes comes to have the following features. That is, a Schottky contact is established between the barrier layer 6 constituting the upper surface of the operating region 11 and the gate electrode 8. Therefore, the HEMT 25 is equipped with a Schottky-type gate electrode. This HEMT 25 can be operated by controlling the electric current flowing between the source electrode and the drain electrode (drain current), since the gate voltage can change the thickness of a depletion layer under the gate electrode 8.

In particular, according to the above arrangement of the HEMT 25, the operating region 11 is covered at its side wall surface layer with the impurity diffusion layer 23 having doped therewith the impurity of which an inverse conductivity type (p-type) to that of the impurity, i.e., n-type, doped into the electron supplying layer 5, and the gate electrode 8 is provided on the impurity diffusion layer 23 at the side wall portion of the operating region 11. For this reason, a PN junction is established at the contact face between the channel layer 3 and the gate electrode 8 and between the electron supplying layer 5 and the gate electrode 8. Therefore, as compared with a conventional HEMT in which there is no impurity diffusion layer 23 provided and the contact face between the channel layer 3 and the gate electrode 8 and between the electron supplying layer 5 and the gate electrode 8 are not the PN junction but a Schottky contact, the HEMT according to the present invention will have a relatively higher energy barrier between the channel layer 3 and the gate electrode 8 and between the electron supplying layer 5 and the gate electrode 8. As a result, carrier mobility can be suppressed between the gate electrode 8 and the operating region 11 at the side wall portion of the operating region 11, with the result that the gate leakage current can be decreased.

With the above arrangement, the gate electrode 8 will become more tolerable in being applied with a reverse-voltage. Therefore, a circuit employing the HEMT will have a wider operating margin. Moreover, noise caused by the gate leakage current can be more suppressed (i.e., a noise factor NF can be decreased).

Moreover, according to the above arrangement of the HEMT, the above mentioned advantages can be obtained without shaping the side wall of the operating region 11 into an inverted-taper. Therefore, the step coverage property can be satisfactorily maintained at a shoulder-shaped portion of the operating region 11, so it is possible to prevent the gate electrode 8 from being cut at the corner portion and formed properly on the operating region 11.

SECOND EMBODIMENT

FIG. 2A to FIG. 2E are cross-sectional views of a semiconductor device as the second embodiment of the present invention for explaining a method of fabricating a HEMT. As shown in the figures, all the diagrams are cross-sectional views taken from a direction which corresponds to the line of VII-VII' of FIG. 6 utilized for explaining the conventional technology.

Figure 2A:
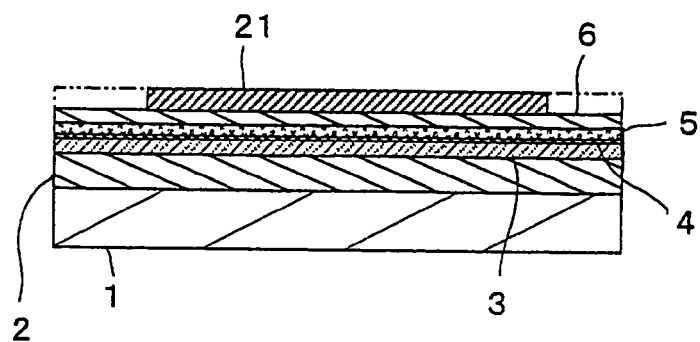
FIG. 2A to FIG. 2E are cross-sectional views of a semiconductor device under fabrication steps for explaining a method of fabricating a second embodiment of the present invention.
Figure 2B:
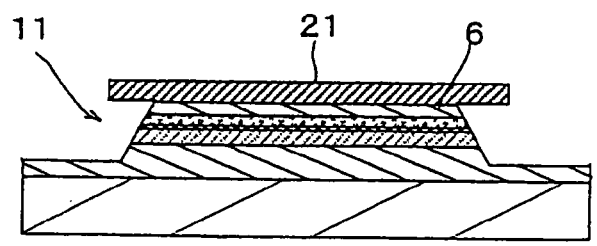

Initially, the fabrication steps shown in FIGS. 2A and 2B are carried out in a manner similar to those of the first embodiment described with reference to FIGS. 1A and 1B, and after forming the operating region 11 as an island structure that is mesa-isolated from other components on the semiconductor device, the pattern 21 utilized as a mask is removed. The pattern 21 may be formed of an insulating film, such as of SiN, or a resist material.

Figure 2C:
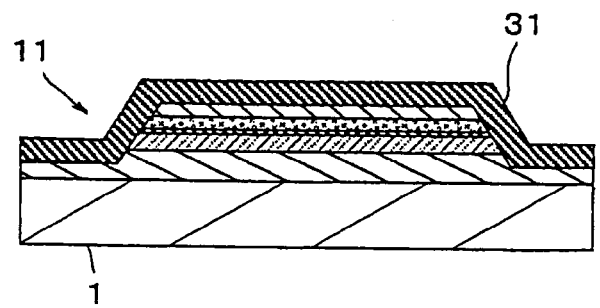

Subsequently, as shown in FIG. 2C, an insulating film 31 made of SiN or the like and having a thickness of 200 nm is formed over the semi-insulating substrate 1 so that this insulating film 31 covers the whole area of the operating region 11.

Figure 2D:
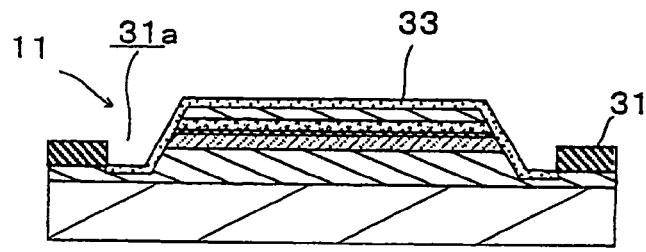

Then, as shown in FIG. 2D, a gate aperture 31a is formed in the insulating film 31. This gate aperture 31a is formed so as to expose an area at which the gate electrode, which is formed in the subsequent fabrication step, will contact the operating region 11.

Thereafter, an impurity diffusion process is carried out through the gate aperture 31a on the surface of the operating region 11 so that an impurity of an inverse conductivity type (i.e., a p-type) to that of the electron supplying layer 5 made of an n-type InAlAs layer is applied. Thus, an impurity diffusion layer 33 of the p-type is formed on the operating region 11. The impurity diffusion layer 33 is formed in a manner similar to that of the first embodiment that is described with reference to FIG. 1C.

Figure 3:
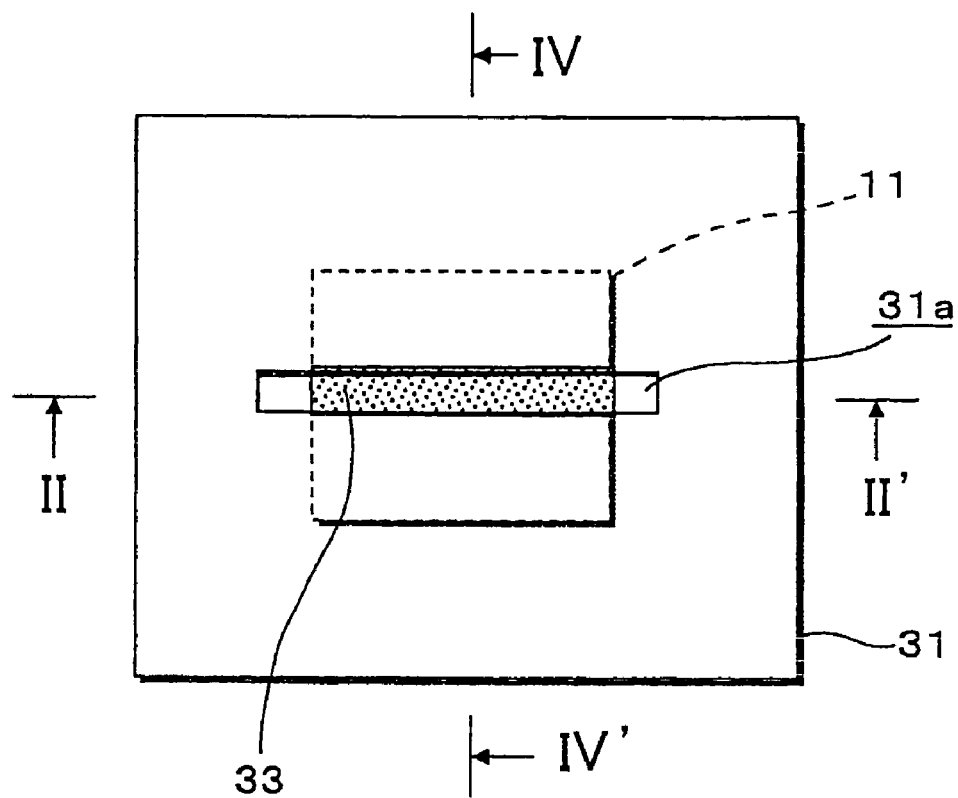
FIG. 3 is a plan view of the semiconductor device under a fabrication step corresponding to FIG. 2D.
Figure 4:
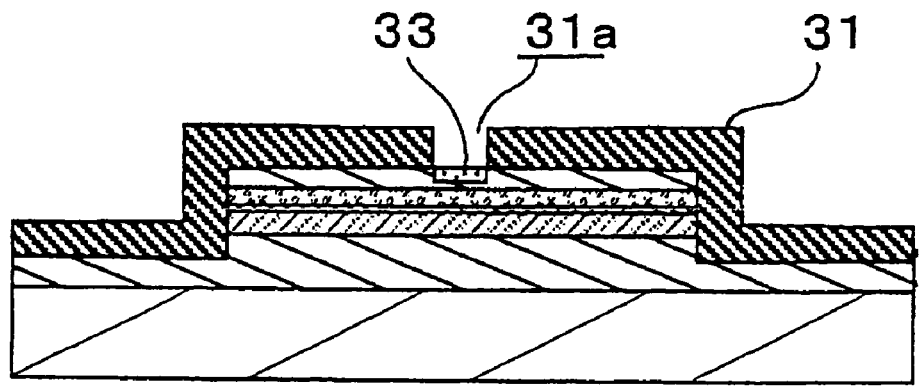
FIG. 4 is a cross-sectional view taken along a line IV–IV' in FIG. 3.

FIG. 3 is a plan view of the device under the fabrication step shown in FIG. 2D. In other words, FIG. 2D is a cross-sectional view taken along a line II–II' in FIG. 3. FIG. 4 is a cross-sectional view taken along a line IV–IV' in FIG. 3. As shown in these figures, the gate aperture 31a formed in the insulating film 31 covering the operating region 11 is formed so as to correspond to a portion of the operating region 11 on which the gate electrode is to be formed in the subsequent fabrication step. Therefore, the impurity diffusion layer 33 formed by the impurity diffusion processing carried out through the gate aperture 31a is provided so as to extend across the upper surface of the operating region 11 from one side wall to the other side wall.

Figure 2E:
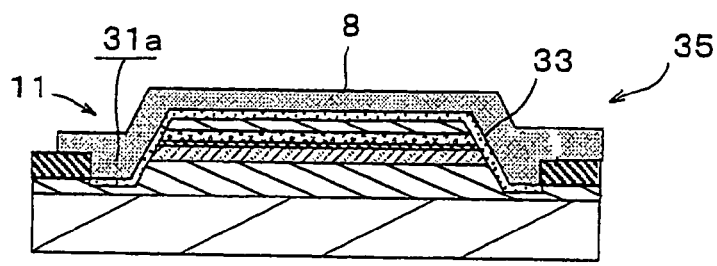

After completing the above-mentioned fabrication steps, as shown in FIG. 2E, the gate electrode 8 is formed so as to embed the inner space of the gate aperture 31a. The gate electrode 8 is formed in a manner similar to that of the first embodiment.

Figure 5:
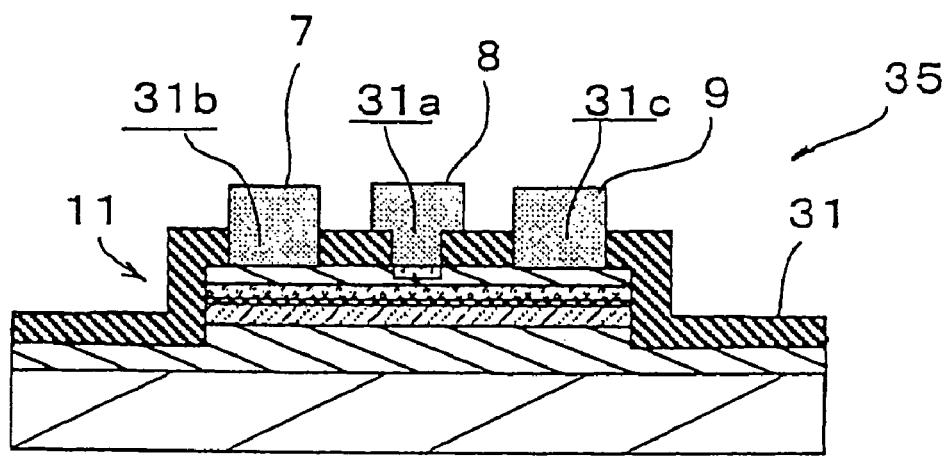
FIG. 5 is a plan view of the semiconductor device under a fabrication step corresponding to FIG. 2E.

FIG. 5 is a cross-sectional view taken along a line whose direction is identical to that of the line IV–IV' in FIG. 3 but the semiconductor device under a fabrication step as the target of illustration is that shown in FIG. 2E. As shown in FIG. 5, after the gate electrode 8 is formed so as to embed the inner space of the gate aperture 31 VII–VII', source aperture 31b and a drain aperture 31c are formed to reach the operating region 11 in the insulating film 31 at both the side portions of the gate aperture 31a. Then, similarly to the first embodiment, a source electrode 7 and a drain electrode 9 are formed so as to embed the inner space of the source aperture 31b and the drain aperture 31c, respectively. In this case, ohmic contact is established between the channel layer 3 and the source electrode 7 and between the channel layer 3 and the drain electrode 9.

If necessary, a heat treatment (e.g., a heat treatment at a temperature of 400° C.) may be carried out after the formation of the electrodes, so that an Ohmic region is created directly beneath the source electrode 7 and the drain electrode 9. In this way, resistance between the channel layer 3 and the source electrode 7 and resistance between the channel layer 3 and the drain electrode 9 can be further decreased.

The HEMT 35 obtained by the above processes comes to have the following features. That is, the gate aperture 31a is provided so as to extend from the upper surface to the side wall of the operating region 11, and the impurity diffusion layer 33 having an electric conductivity of p-type is formed at the bottom of the gate aperture 31a. Further, since the gate electrode 8 is formed within the gate aperture 31a, the gate electrode 8 can serve as a junction-type gate electrode. This HEMT 35 can be operated by controlling an electric current (drain current) flowing between the source electrode and the drain electrode, since the gate voltage can change the thickness of a depletion layer under the gate electrode 8.

In particular, according to the above arrangement of the HEMT 35, the operating region 11 is covered at its surface layer with the impurity diffusion layer 33, the impurity diffusion layer 33 is doped with an impurity having a conductivity type (p-type) inverse to that of the impurity, i.e., an n-type, which is doped into the electron supplying layer 5, and the gate electrode 8 is provided on the impurity diffusion layer 33 at the operating region 11. For this reason, similar to the HEMT 25 of the first embodiment, a PN junction is established at the contact face between the channel layer 3 and the gate electrode 8 and between the electron supplying layer 5 and the gate electrode 8. Accordingly, it becomes possible to obtain advantages similar to those of the first embodiment.

Furthermore, according to the above-described methods of fabricating the semiconductor device, the above-mentioned HEMT 35 can be obtained by adding only one fabrication step, i.e., a step of diffusing an impurity process, to a series of steps of fabricating the semiconductor device as the first embodiment. Therefore, a rise in the production cost of the semiconductor device can be reduced.

The above-described embodiments are merely examples of the present invention, and, therefore, the present invention is not limited to the above-described embodiments. Therefore, the present invention can be applied similarly to a case where the operating region is composed of semiconductor layers different from those of the above-described example materials, the multilayer structure or the like, so long as the semiconductor device has an operating region which is composed of a plurality of multilayer films made of semiconductor layers and is mesa-isolated from other components in an island structure on the semiconductor device. Also, such a semiconductor device applied with the present invention will produce the same advantages as those of the above-described embodiments.

What is claimed is:

1. A semiconductor device having an operating region formed by mesa-isolating multilayer films of semiconductor layers including a first conductivity type impurity into an island structure and an electrode film provided on said operation region so as to extend from an upper surface to a side wall of said operating region, wherein:

said semiconductor device comprising an impurity diffusion layer including a second conductivity type impurity which is different from said first conductivity type impurity doped into said multilayer films of a surface layer of the side wall of said operating region at an area contacting with said electrode film, said first conductivity type is p-type, and said second conductivity type is n-type.

* * * * *